(12) United States Patent
Min

(10) Patent No.: US 12,538,818 B2
(45) Date of Patent: Jan. 27, 2026

(54) SUBSTRATE INCLUDING BRIDGE AND ELECTRONIC DEVICE

(71) Applicant: SAMSUNG ELECTRO-MECHANICS CO., LTD., Suwon-si (KR)

(72) Inventor: Tae Hong Min, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 864 days.

(21) Appl. No.: 17/749,623

(22) Filed: May 20, 2022

(65) Prior Publication Data

US 2023/0187360 A1   Jun. 15, 2023

(30) Foreign Application Priority Data

Dec. 13, 2021   (KR) .......................... 10-2021-0177580

(51) Int. Cl.
*H01L 23/538*   (2006.01)
*H01L 21/48*   (2006.01)
(Continued)

(52) U.S. Cl.
CPC ...... *H01L 23/5381* (2013.01); *H01L 21/4857* (2013.01); *H01L 23/5383* (2013.01); *H01L 25/0655* (2013.01); *H01L 25/18* (2013.01)

(58) Field of Classification Search
CPC ............. H01L 23/5381; H01L 21/4857; H01L 23/5383; H01L 25/0655; H01L 25/18
See application file for complete search history.

(56) References Cited

U.S. PATENT DOCUMENTS 5,801,597 A   9/1998 Carter et al.
8,441,809 B2 *   5/2013 Mahajan ................. H01L 24/16
361/762

(Continued)

FOREIGN PATENT DOCUMENTS

JP   H10-261889 A   9/1998
JP   2017-28233 A   2/2017
(Continued)

OTHER PUBLICATIONS

Korean Office Action dated Jul. 21, 2025 issued in Korean Patent Application No. 10-2021-0177580 (with English translation).

*Primary Examiner* — Eugene Lee
(74) *Attorney, Agent, or Firm* — Morgan Lewis & Bockius LLP

(57) ABSTRACT

A substrate includes: a first printed circuit board layer including a first insulating layer and a first wiring layer, disposed on a lower surface of the first insulating layer; a second wiring layer, disposed on an upper surface of the first insulating layer; a bridge disposed above the first printed circuit board layer and including circuit wirings; a first bridge insulating layer and a second bridge insulating layer, disposed in the bridge and on which the circuit wirings are disposed, respectively; and a second printed circuit board layer including a second insulating layer surrounding side surfaces of the bridge and covering the first insulating layer and the second wiring layer. A first stacking direction in which the first insulating layer and the second insulating layer are stacked and a second stacking direction in which the first bridge insulating layer and the second bridge insulating layer are stacked are different.

21 Claims, 12 Drawing Sheets

(51) Int. Cl.
*H01L 25/065* (2023.01)
*H01L 25/18* (2023.01)

(56) References Cited

U.S. PATENT DOCUMENTS

| | | | | |
|---|---|---|---|---|
| 8,946,900 | B2* | 2/2015 | Qian | H01L 25/105 257/762 |
| 9,368,450 | B1* | 6/2016 | Gu | H01L 23/5385 |
| 10,615,133 | B2* | 4/2020 | Kamgaing | H01L 25/50 |
| 11,658,124 | B2* | 5/2023 | Jang | H01L 24/19 361/777 |
| 12,051,651 | B2* | 7/2024 | Manusharow | H01L 25/50 |
| 2015/0116965 | A1* | 4/2015 | Kim | H01L 23/5385 361/767 |
| 2015/0318236 | A1* | 11/2015 | Zhang | H01L 23/49822 174/257 |
| 2017/0018494 | A1 | 1/2017 | Noda et al. | |
| 2017/0170121 | A1* | 6/2017 | Haba | H01L 23/5381 |
| 2018/0331042 | A1* | 11/2018 | Manusharow | H01L 21/4857 |
| 2019/0341320 | A1* | 11/2019 | Pollard | H01L 21/561 |
| 2019/0363049 | A1* | 11/2019 | Mekonnen | H01L 21/486 |
| 2020/0098710 | A1 | 3/2020 | Nair et al. | |
| 2021/0082822 | A1 | 3/2021 | Aleksov et al. | |
| 2022/0262713 | A1 | 8/2022 | Na et al. | |
| 2024/0079334 | A1* | 3/2024 | Ecton | H01L 23/49822 |
| 2025/0015003 | A1* | 1/2025 | Pietambaram | H01L 24/97 |
| 2025/0112168 | A1* | 4/2025 | Karhade | H01L 25/50 |

FOREIGN PATENT DOCUMENTS

| | | |
|---|---|---|
| KR | 10-2015-0107527 A | 9/2015 |
| KR | 10-2019-0093189 A | 8/2019 |
| KR | 10-2020-0069573 A | 6/2020 |
| KR | 10-2021-00000105 A | 1/2021 |
| KR | 10-2021-0032892 A | 3/2021 |

* cited by examiner

SUBSTRATE INCLUDING BRIDGE AND ELECTRONIC DEVICE

CROSS-REFERENCE TO RELATED APPLICATION(S)

This application claims benefit of priority to Korean Patent Application No. 10-2021-0177580 filed on Dec. 13, 2021 in the Korean Intellectual Property Office, the disclosure of which is incorporated herein by reference in its entirety.

TECHNICAL FIELD

The present disclosure relates to a substrate including a bridge and an electronic device.

BACKGROUND

Recently, in the electronic components industry, highly integrated printed circuit boards (PCBs) have been required in order to cope with 5G high-speed communications and artificial intelligence (AI). A microcircuit is a core technology for the highly integrated PCB, and research into and development of the microcircuit have currently been actively conducted in the industry, but a problem such as an increase in costs may be caused by a decrease in yield in the manufacturing of a substrate due to multiple layers and a large area. Therefore, a technology of separately manufacturing the microcircuit for a region requiring the microcircuit in a bridge form and embedding the manufactured microcircuit in a large-area substrate has been used, and a representative example of such a technology may include an embedded multi-die interconnect bridge (EMIB) technology.

Meanwhile, in a case of an EMIB, the microcircuit is patterned using a bridge formed of silicon. This may decrease a pattern interval of the microcircuit and a thickness of the bridge. On the other hand, since the EMIB is manufactured using a semiconductor process, equipment used therefor is relatively expensive, and thus, manufacturing costs are high while a quality of power and signal transfer is poor.

In addition, processes of manufacturing the EMIB include a process of forming a cavity in a PCB and then fixing the bridge into the cavity using an adhesive. Accordingly, a cavity forming process for insertion of the bridge is additionally required, and the adhesive used for bonding the bridge, for example, a die attach film (DAF), has a short lifespan and is relatively expensive, and thus, post-management costs may increase.

SUMMARY

An aspect of the present disclosure may provide a substrate in which a bridge is embedded or mounted without performing a separate process of forming a cavity in the substrate and without using a separate adhesive for bonding the bridge.

An aspect of the present disclosure may also provide a substrate capable of improving electrical characteristics by forming a microcircuit in a bridge for high-speed signal transmission between dies using an organic substrate.

An aspect of the present disclosure may provide a substrate including a bridge.

According to an aspect of the present disclosure, a substrate may include: a first printed circuit board layer including a first insulating layer and a first wiring layer, disposed on a lower surface of the first insulating layer; a second wiring layer, disposed on an upper surface of the first insulating layer; a bridge disposed above the first printed circuit board layer and including a first circuit wiring, a second circuit wiring, and a third circuit wiring connecting the first circuit wiring and the second circuit wiring to each other; a first bridge insulating layer and a second bridge insulating layer, disposed in the bridge and on which the first circuit wiring and the second circuit wiring are disposed, respectively; and a second printed circuit board layer including a second insulating layer positioned to surround side surfaces of the bridge and cover the first insulating layer and the second wiring layer. A first stacking direction in which the first insulating layer and the second insulating layer are stacked and a second stacking direction in which the first bridge insulating layer and the second bridge insulating layer are stacked may be different from each other.

An aspect of the present disclosure may also provide an electronic device including a substrate including a bridge.

According to another aspect of the present disclosure, an electronic device may include: a substrate including: a first printed circuit board layer including a first insulating layer and a first wiring layer, disposed on a lower surface of the first insulating layer; a bridge disposed above the first printed circuit board layer and including a first circuit wiring, a second circuit wiring, and a third circuit wiring connecting the first circuit wiring and the second circuit wiring to each other; a first bridge insulating layer and a second bridge insulating layer, disposed in the bridge and on which the first circuit wiring and the second circuit wiring are disposed, respectively; and a second printed circuit board layer including a second insulating layer positioned to surround side surfaces of the bridge, a first chip connected to the first circuit wiring; a second chip connected to the second circuit wiring; and a main substrate on which the substrate connected to the first chip and the second chip is mounted. The substrate may be stacked in the form of an interposer between the first and second chips and the main substrate, and a first stacking direction in which the first insulating layer and the second insulating layer are stacked and a second stacking direction in which the first bridge insulating layer and the second bridge insulating layer are stacked may be different from each other.

According to another aspect of the present disclosure, an electronic device may include: a substrate including: a printed circuit board including a first wiring layer disposed on a first insulating layer and a second wiring layer disposed on a second insulating layer; a bridge disposed above the printed circuit board and including a first circuit wiring, a second circuit wiring, and a third circuit wiring connecting the first circuit wiring and the second circuit wiring to each other; and a first bridge insulating layer and a second bridge insulating layer, disposed in the bridge and on which the first circuit wiring and the second circuit wiring are disposed, respectively; a first chip connected to the first circuit wiring; a second chip connected to the second circuit wiring; and a main substrate in which the substrate connected to the first chip and the second chip is embedded and mounted. A first stacking direction in which the first insulating layer and the second insulating layer are stacked and a second stacking direction in which the first bridge insulating layer and the second bridge insulating layer are stacked may be different from each other.

According to another aspect of the present disclosure, a substrate may include: a first insulating layer; a first wiring layer disposed on or in the first insulating layer; a bridge disposed on the first insulating layer, and including circuit wiring layers and bridge insulating layers alternately stacked in a direction different from a stacking direction of the bridge and the first insulating layer; a second insulating layer disposed on the first insulating layer, covering side surfaces of the bridge, and extending between the bridge and the first wiring layer; and a via disposed in a portion of the second insulating layer between the bridge and the first wiring layer to connect one of the circuit wiring layers to the first wiring layer.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
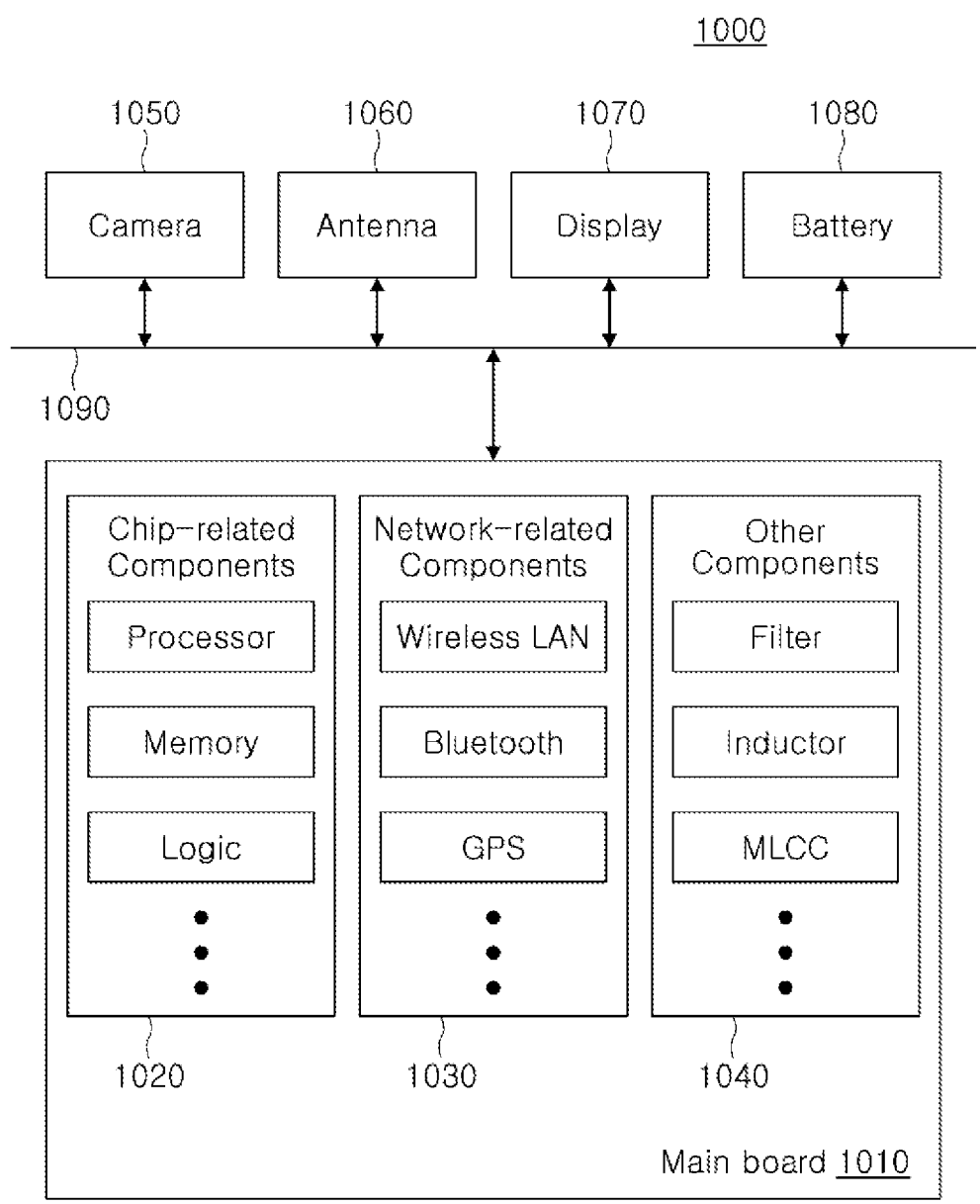
FIG. 1 is a schematic block diagram illustrating an example of an electronic device system.

Hereinafter, exemplary embodiments in the present disclosure will be described with reference to the accompanying drawings. In the accompanying drawings, shapes, sizes, and the like, of components may be exaggerated or shortened for clarity.

Herein, expressions such as a side portion and a side surface are used to refer to a left/right direction or a surface in the left/right direction in the drawings for convenience, expressions such as an upper side, an upper portion, and an upper surface are used to refer to an upward direction or a surface in the upward direction in the drawings for convenience, and expressions such as a lower side, a lower portion, and a lower surface are used to refer to a downward direction or a surface in the downward direction in the drawings for convenience. In addition, "positioned on the side portion, on the upper side, above, on the lower side, or below" conceptually includes a case in which a target component is positioned in a corresponding direction, but does not be in direct contact with a reference component, as well as a case in which the target component is in direct contact with the reference component in the corresponding direction. However, these directions are defined for convenience of explanation, and the claims are not particularly limited by the directions defined as described above, and concepts of upper and lower portions may be exchanged with each other at any time.

Herein, "substantially the same" does not refer to "the exact same", and may be concepts including a process error or a position deviation occurring in a manufacturing process, an error at the time of performing measurement, and the like.

The meaning of a "connection" of a component to another component in the description conceptually includes an indirect connection through an adhesive layer as well as a direct connection between two components. In addition, "electrically connected" conceptually includes a physical connection and a physical disconnection. It may be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-digital converter (ADC), an application-specific integrated circuit (ASIC), or the like. However, these chip related components 1020 are not limited thereto, and may also include other types of chip related components. In addition, these chip related components may be combined with each other. These chip related components 1020 may have a package form including the chips described above.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, and may also include a variety of other wireless or wired standards or protocols. In addition, these network related components 1030 may be combined with the chip related components 1020 to be provided in a package form.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, these other components 1040 are not limited thereto, but may also include chip component types of passive components used for various other purposes, or the like. In addition, these other components 1040 may be combined with the chip related components 1020 and/or the network related components 1030 to be provided in a package form.

Depending on a type of the electronic device 1000, the electronic device 1000 may include other components that may or may not be physically or electrically connected to the mainboard 1010. These other electronic components may include, for example, a camera 1050, an antenna 1060, a display 1070, a battery 1080, or the like. These other electronic components are not limited thereto, and may be an audio codec, a video codec, a power amplifier, a compass, an accelerometer, a gyroscope, a speaker, a mass storage unit (for example, a hard disk drive), a compact disk (CD) drive, a digital versatile disk (DVD) drive, or the like. These other electronic components may also include other electronic components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
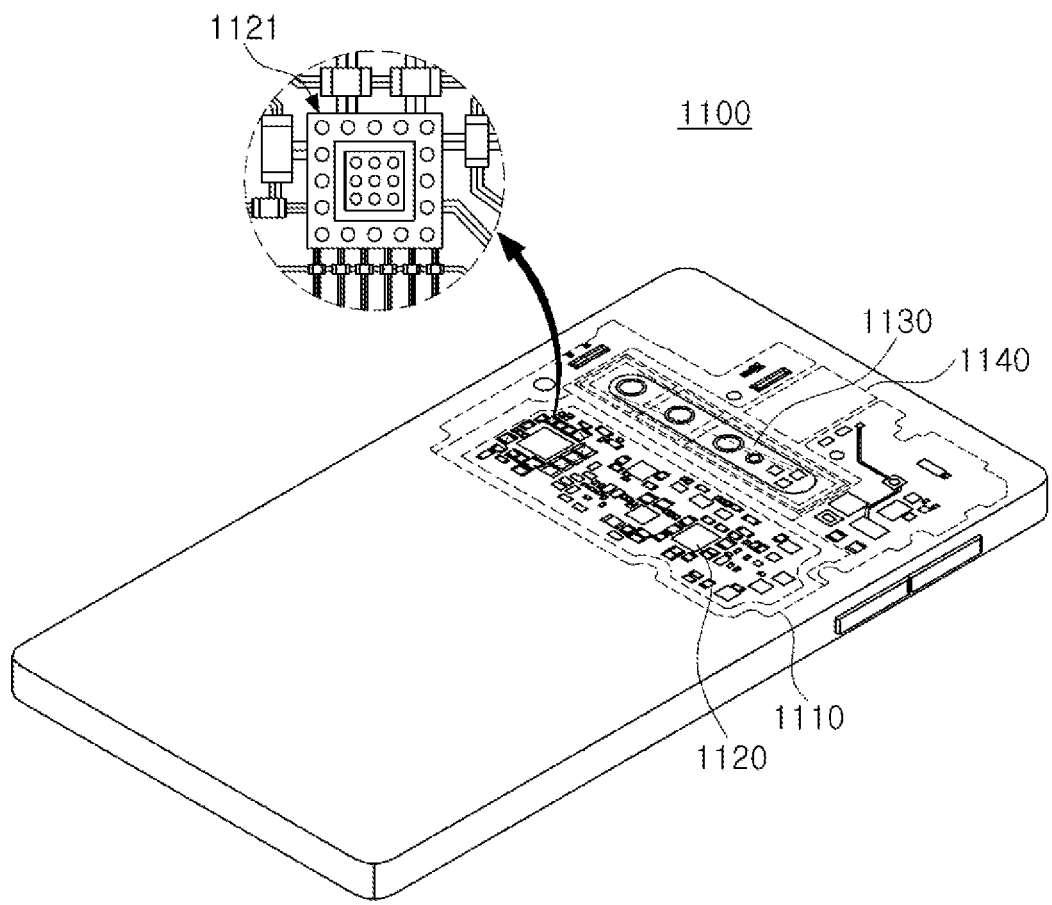
FIG. 2 is a schematic perspective view illustrating an example of an electronic device.

FIG. 2 is a schematic perspective view illustrating an example of an electronic device.

Referring to FIG. 2, an electronic device may be, for example, a smartphone 1100. A motherboard 1110 may be accommodated in the smartphone 1100, and various electronic components 1120 may be physically or electrically connected to the motherboard 1110. In addition, a camera module 1130 and/or a speaker 1140 may be accommodated in the motherboard 1110. Some of the electronic components 1120 may be the chip related components described above, such as a bridge embedded substrate 1121 having a plurality of electronic components mounted on a surface thereof, but are not limited thereto. Meanwhile, the electronic device is not necessarily limited to the smartphone 1100, but may be other electronic devices as described above.

Figure 3:
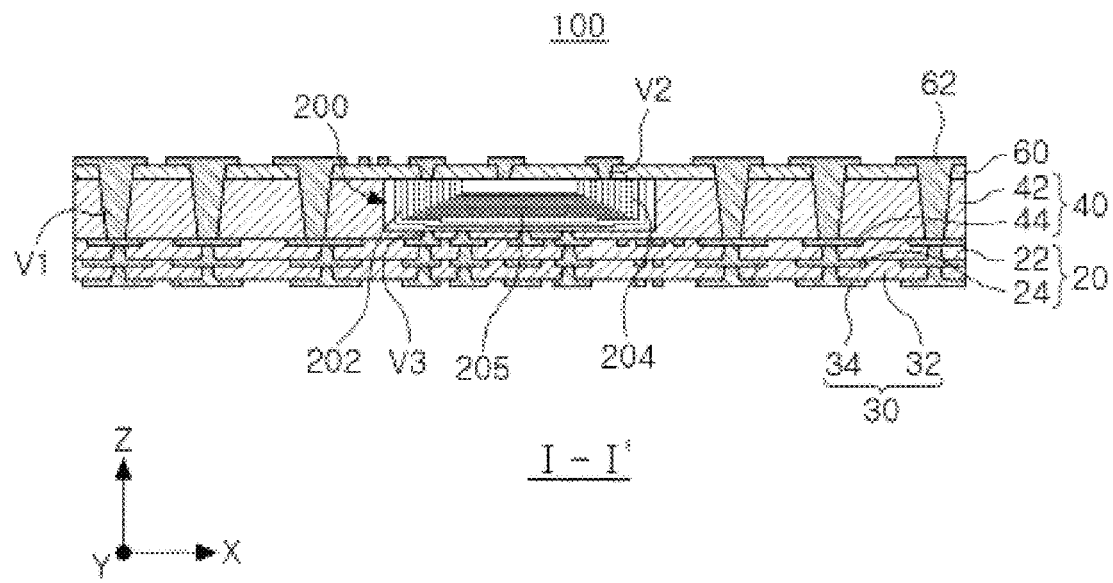
FIG. 3 is a schematic cross-sectional view illustrating a substrate including a bridge according to an exemplary embodiment in the present disclosure.

FIG. 3 is a schematic cross-sectional view illustrating a substrate including a bridge according to an exemplary embodiment in the present disclosure.

Referring to FIG. 3, a substrate 100 according to an exemplary embodiment in the present disclosure may include a first printed circuit board layer 20, a bridge 200, bridge insulating layers 220 and 240 (see FIGS. 7A through 7C), and a second printed circuit board layer 40.

The first printed circuit board layer 20 may include a plurality of layers. In FIG. 3, a third printed circuit board layer 30 may be disposed below the first printed circuit board layer 20 in a stacking direction Z on the first printed circuit board layer 20, perpendicular to a length direction X of the first printed circuit board layer. In the present embodiment, all of the third printed circuit board layers 30 disposed below the stacking direction Z of the first printed circuit board layer 20 may be referred to as first printed circuit board layers 20. First insulating layers 22 and third insulating layers 32 may be repeatedly built up to become a multilayer circuit board, and the numbers of first and second insulating layers may be selected if necessary.

The bridge 200 may be an interconnector element providing high-density routing between chips, and may be a circuit element used for chip-to-chip interconnection. The bridge 200 according to the present exemplary embodiment may be embedded in a cavity formed in a printed circuit board to which a connection is formed, but may also be stacked and formed so that side surfaces thereof are surrounded by a second insulating layer 42 positioned above the first printed circuit board layer 20 without forming a cavity. Specifically, the second printed circuit board layer 40 may include the second insulating layer 42 and a second wiring layer 44 disposed on a lower surface of the second insulating layer 42. The second wiring layer 44 may be disposed on an upper surface of the first insulating layer 22. In addition, the second insulating layer 42 of the second printed circuit board layer 40 may be positioned to cover the first insulating layer 22 and the second wiring layer 44.

The first printed circuit board layer 20 may include the first insulating layer 22 and a first wiring layer 24 disposed on the first insulating layer 22. The third printed circuit board layer 30 may also include the third insulating layer 32 and a third wiring layer 34 disposed on the third insulating layer 32. The second wiring layer 44, of which one surface is exposed, may be included on the lower surface of the second insulating layer 42 surrounding the bridge 200.

The wiring layers 24, 34, and 44 may be connection pads embedded in the insulating layers 22, 32, and 42, respectively, so as to be exposed to one surfaces of the insulating layers 22, 32, and 42, respectively, and may include wiring lines.

The wiring layers 24, 34, and 44 may be conductive metal layers formed by a method such as electroplating, chemical plating, or sputtering, and may be metal layers formed of copper (Cu), aluminum (Al), silver (Ag), tin (Sn), gold (Au), nickel (Ni), lead (Pb), titanium (Ti), or alloys thereof.

The insulating layers 22, 32, and 44 may be formed of an insulating material containing glass or an inorganic insulating resin that does not contain glass. The insulating material containing glass may be prepreg (PPG), and the inorganic insulating resin that does not contain glass may be an Ajinomoto build-up film (ABF). The insulating material is not particularly limited.

In addition, each of the insulating layers 22, 32, and 44 may be an organic insulating layer including at least one of Ajinomoto build-up film (ABF) and polyimide, but is not limited thereto.

The bridge 200 may be disposed above the first printed circuit board layer 20, and may include first circuit wirings 202, second circuit wirings 204, and third circuit wirings 205 connecting the first circuit wirings 202 and the second circuit wirings 204 to each other.

The first, second, and third circuit wirings 202, 204, and 205 of the bridge 200 may be conductive metal wirings formed by a method such as electroplating, chemical plating, or sputtering, and may be formed of copper (Cu), aluminum (Al), silver (Ag), tin (Sn), gold (Au), nickel (Ni), lead (Pb), titanium (Ti), or alloys thereof.

When logic chips or memory chips are mounted on the substrate, the first, second, and third circuit wirings 202, 204, and 205 of the bridge 200 may become high-density interconnection lines through which chip-to-chip high-speed signal transmission is performed between the chips.

The first, second, and third circuit wirings 202, 204, and 205 of the bridge 200 are formed on first bridge insulating layers 220 and second bridge insulating layers 240, respectively. The first bridge insulating layer 220 and the second bridge insulating layer 240 may be organic insulating layers and may include at least one of Ajinomoto Build-up Film (ABF) and polyimide, but are not limited thereto. A dielectric loss factor (Df) of the organic insulating layer may be 0.010 or less, for example, 0.005 or less. In a case of using ABF and/or polyimide under such conditions, when a plurality of chips are mounted on the substrate 100, electrical characteristics at the time of high-speed signal transmission between the chips may be further improved. If necessary, a dielectric constant (Dk) of the organic insulating layer may be 3.5 or less, for example, 3.2 or less.

A first stacking direction Z in which the first insulating layer 22 and the second insulating layer 42 are stacked and a second stacking direction Y in which the first bridge insulating layers 220 and the second bridge insulating layers 240 are stacked may be different from each other.

The length direction X, the first stacking direction Z, and the second stacking direction Y of the substrate 100 may be substantially orthogonal to each other.

Meanwhile, the first circuit wirings 202 and the second circuit wirings 204 of the bridge 200 may be formed to be substantially parallel to the first stacking direction Z, and the third circuit wirings 205 may be substantially parallel to the second stacking direction Y.

The first circuit wirings 202, the second circuit wirings 204, and the third circuit wirings 205 may include metal layers formed of copper (Cu), aluminum (Al), silver (Ag), tin (Sn), gold (Au), and nickel (Ni), lead (Pb), titanium (Ti), or alloys thereof.

In addition, an end portion of each of the first circuit wirings 202 and the second circuit wirings 204 may be exposed to an upper surface of the bridge 200.

In addition, the second wiring layer 44 may be formed on the lower surface of the second insulating layer 42, and the third circuit wirings 205 of the bridge 200 may be connected to the second wiring layer 44 exposed to the lower surface of the second insulating layer 42 through third vias V3. Here, at least some of the third circuit wirings 205 may be exposed to a lower surface of the bridge 200.

In addition, at least one of the first circuit wirings 202, the second circuit wirings 204, and the third circuit wirings 205 may include copper (Cu), end portions of the first circuit wirings 202 and the second circuit wirings 204 may be flip-chip bonded to chips, and the exposed end portions of the first circuit wirings 202 and the second circuit wirings 204 may be formed of tin (Sn) in order to decrease a pitch between the wirings.

Figure 7A:
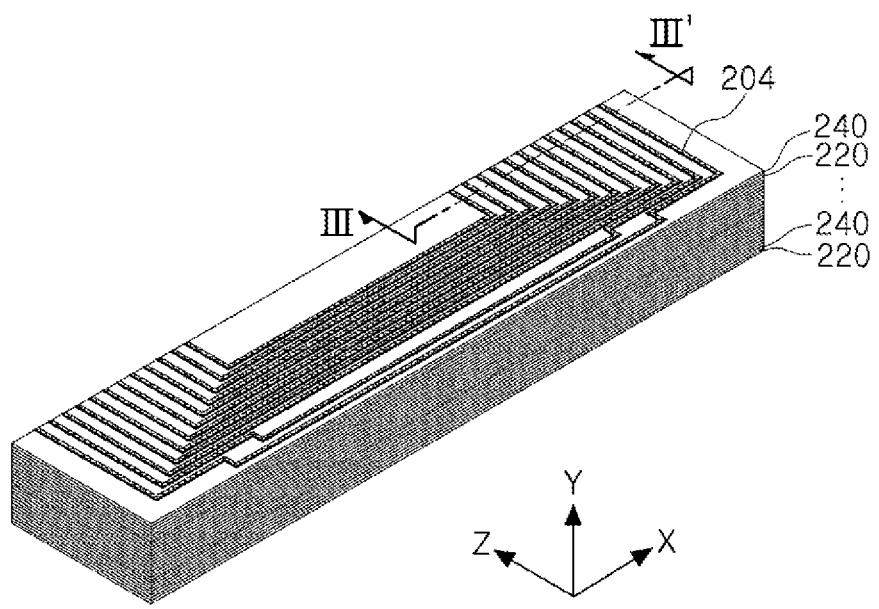
Figure 7B:
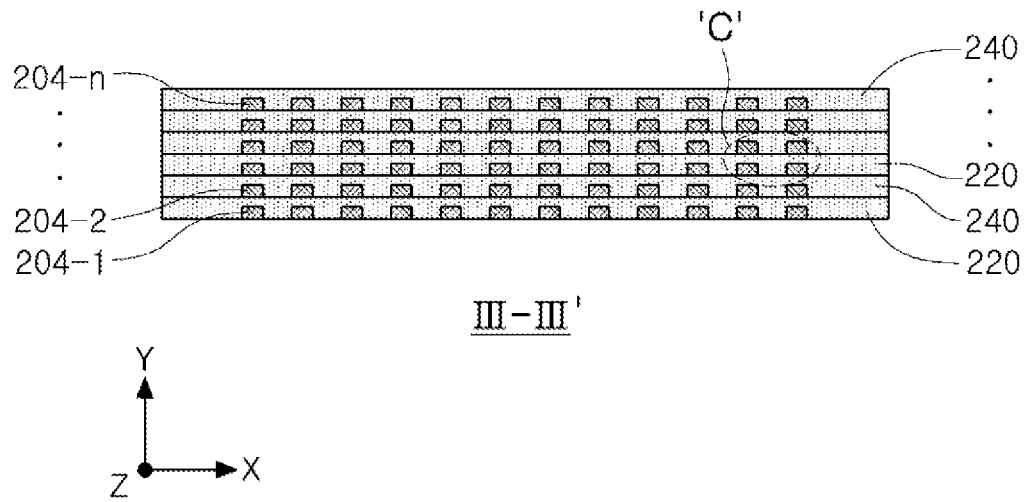
Figure 7C:
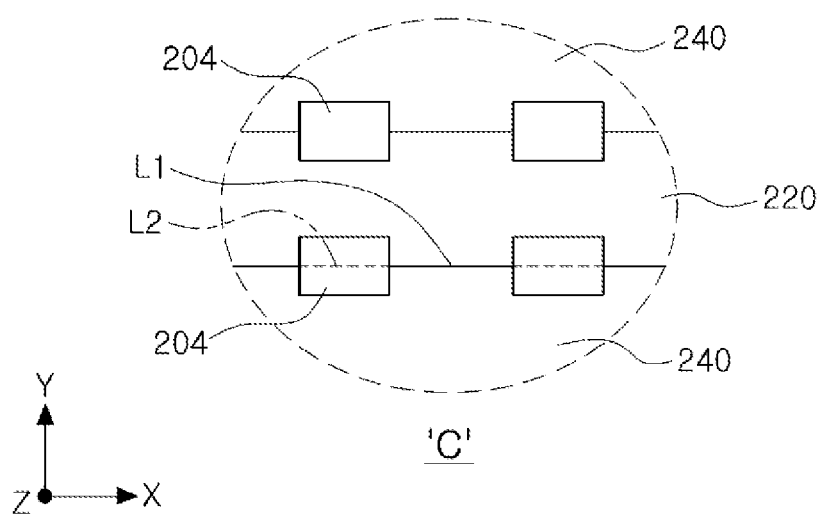

The end portion may be partially recessed in a boundary line L1 between the first bridge insulating layer 220 and the second bridge insulating layer 240, such that a virtual line L2 of the boundary line L1 may pass through the end portion (see FIG. 7C).

In addition, an organic insulating layer 60 may be formed on the upper surface of the bridge 200. The organic insulating layer 60 may be stacked in the first stacking direction Z, and may be substantially orthogonal to the second stacking direction Y in which the first bridge insulating layers 220 and the second bridge insulating layers 240 are stacked.

An external wiring layer 62 may be formed on an upper surface of the organic insulating layer 60. The external wiring layer 62 may be connected to the second wiring layer 44 formed on the lower surface of the second insulating layer 42 through first vias V1. An exemplary embodiment in which the first vias V1 penetrate through both the organic insulating layer 60 and the second insulating layer 42 has been illustrated in FIG. 3, but if necessary, vias penetrating through the organic insulating layer 60 and a wiring layer disposed on an upper surface of the second insulating layer 42 may be further formed and vias penetrating through only the second insulating layer 42 may be formed so as to connect the wiring layer and the second wiring layer 44 to each other.

In addition, the end portion of each of the first circuit wirings 202 and the second circuit wirings 204 exposed to the upper surface of the bridge 200 may be connected to the external wiring layer 62 through second vias V2 penetrating through the organic insulating layer 62.

In addition, thicknesses of the first bridge insulating layer 220 and the second bridge insulating layer 240 may be smaller than thicknesses of the first insulating layer 20 and the second insulating layer 40.

FIGS. 4A through 7C are schematic views illustrating an example of processes of manufacturing a bridge to be mounted in a substrate according to an exemplary embodiment in the present disclosure. Respective processes according to an exemplary embodiment may be performed in a different order unless the context clearly indicates a specific order.

Figure 4A:
FIGS. 4A through 7C are schematic views illustrating an example of processes of manufacturing a bridge to be mounted in a substrate according to an exemplary embodiment in the present disclosure.

First, as illustrated in FIG. 4A, an insulating core 10 having a base copper layer 14 formed on at least one surface thereof may be prepared. A dry film 12 may be provided below the base copper layer 14. The insulating core 10 according to the present exemplary embodiment may be a carrier substrate having base copper layers 14 stacked on both surfaces thereof.

Figure 4B:
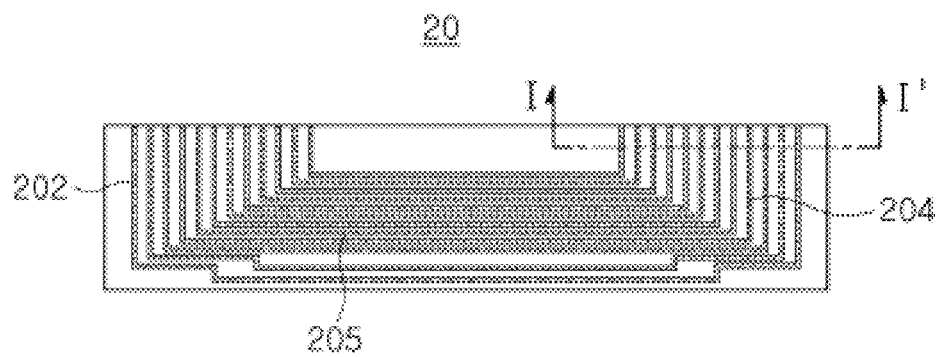
Figure 4C:
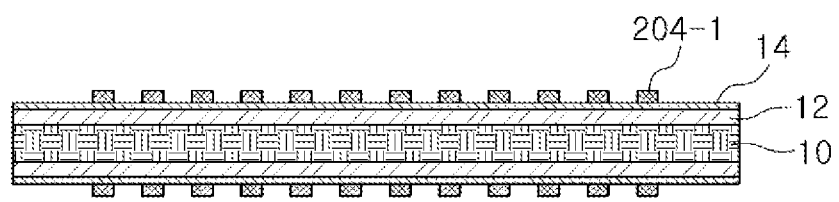

As illustrated in FIG. 4B, circuit patterns (first wiring circuits, second wiring circuits, and third wiring circuits) in a bridge may be formed in a "⊏" shape or a desired design on the base copper layer 14. FIG. 4C is a cross-sectional view taken along line I-I' of FIG. 4B. The circuit patterns, for example, second wiring circuits 204-1 may be designed to have an appropriate pitch depending on a required design.

Figure 5:
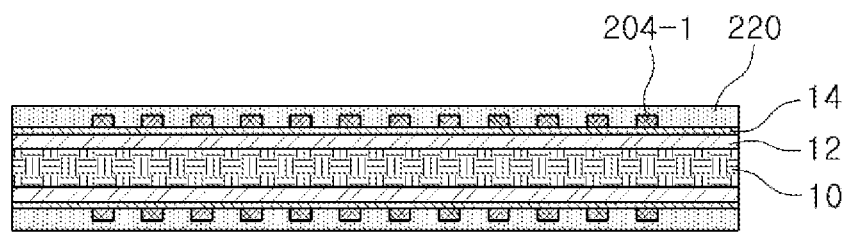

FIG. 5 illustrates a process of forming the first bridge insulating layer 220 after the circuit patterns of FIG. 4B, for example, the second wiring circuits 204-1 are formed. The first bridge insulating layer 220 may be formed by applying and hardening an insulating material or stacking and hardening an insulating film.

Figure 6A:
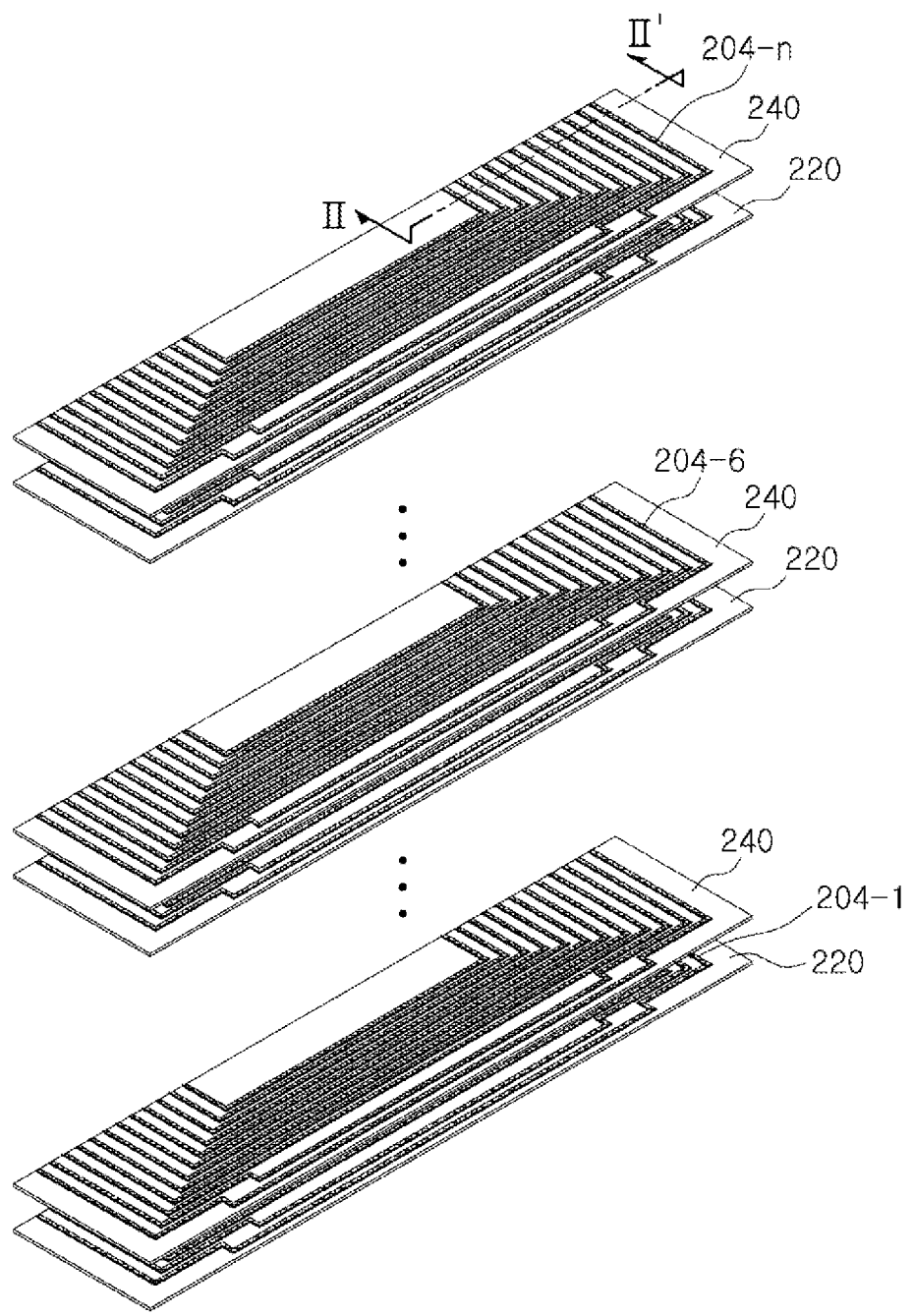
Figure 6B:
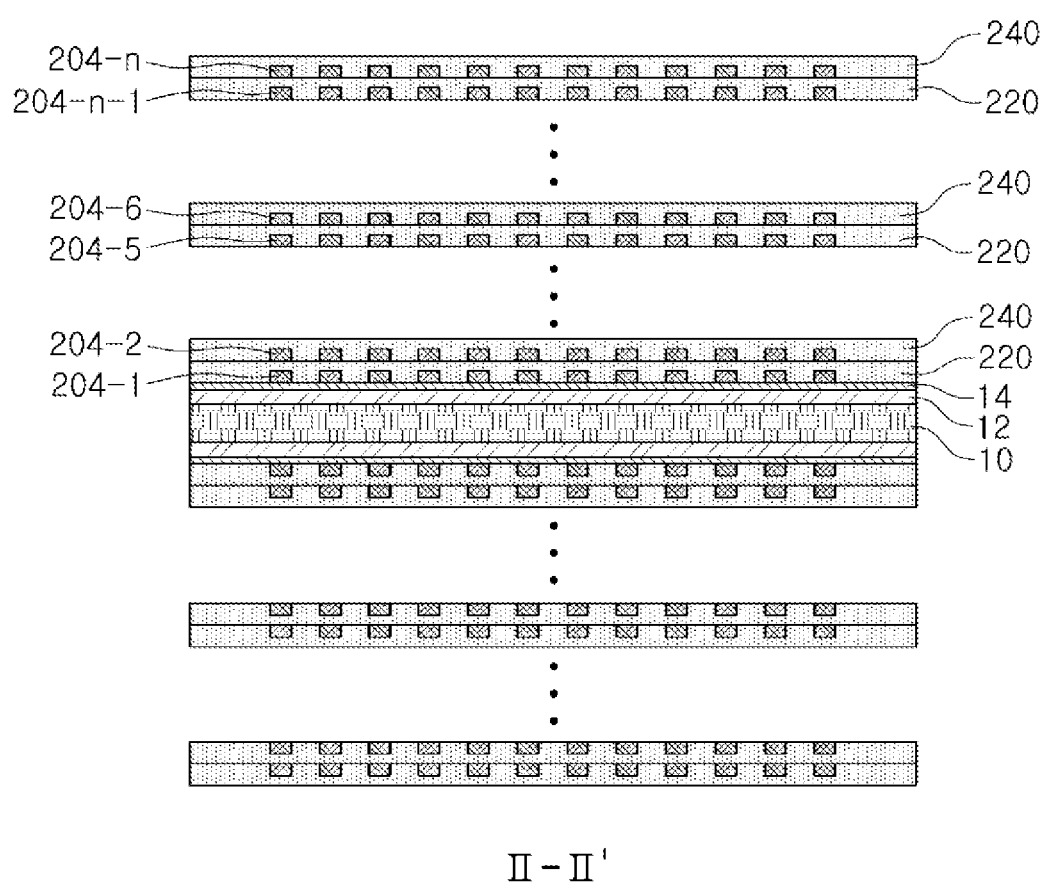

FIGS. 6A and 6B illustrate repeated processes of forming circuit patterns, for example, second wiring circuit 204-2 on the first bridge insulating layer 220 and then forming the second bridge insulating layer 240. FIG. 6A is a perspective view illustrating circuit patterns and bridge insulating layers that are repeatedly stacked, and FIG. 6B is a cross-sectional view taken along line II-II' of FIG. 6A. FIG. 6B illustrates a process of repeatedly stacking circuit patterns, for example, second wiring circuits 204-1, 204-2, . . . , 204-5, 204-6, . . . , 204-n-1, and 204-n and the first and second bridge insulating layers 220 and 240.

FIG. 7A is a perspective view illustrating a state in which a laminate of the first and second bridge insulating layers 220 and 240 on which the circuit patterns are formed is separated from the insulating core 10, and FIG. 7B is a cross-sectional view taken along line III-III' of FIG. 7A and is a cross-sectional view of a bridge laminate separated from the insulating core 10.

When the first bridge insulating layers 220 and the second bridge insulating layers 240 of the bridge laminate are hardened, compression may partially occur. Referring to FIG. 7C, which is an enlarged view of part 'C' of FIG. 7B, a structure in which upper portions of the first bridge insulating layers 220 and the second bridge insulating layers 240 of the bridge laminate are cut may be completed, be erected at 90°, and prepared to be inserted into the substrate.

Here, since an upper portion of the bridge laminate is cut, an end portion of each of the first circuit wirings 202 and the second circuit wirings 204 may be exposed to an upper surface of the bridge 200.

In addition, the end portion may be partially recessed in the boundary line L1 between the first bridge insulating layer 220 and the second bridge insulating layer 240, such that the virtual line L2 of the boundary line L1 may pass through the end portion.

FIGS. 8A through 14 are schematic views illustrating an example of processes of mounting the bridge manufactured in FIGS. 7A through 7C in a substrate.

Figure 8A:
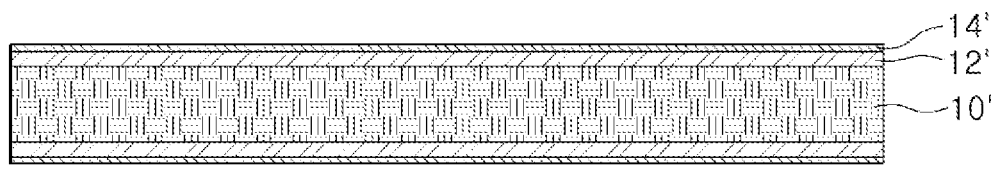
FIGS. 8A through 14 are schematic views illustrating an example of processes of mounting the bridge manufactured in FIGS. 7A through 7C in a substrate.

First, as illustrated in FIG. 8A, an insulating core 10' having a base copper layer 14' formed on at least one surface thereof may be prepared. A dry film 12' may be provided below the base copper layer 14'. The insulating core 10' according to the present exemplary embodiment may be a carrier substrate having base copper layers 14' stacked on both surfaces thereof.

Figure 8B:
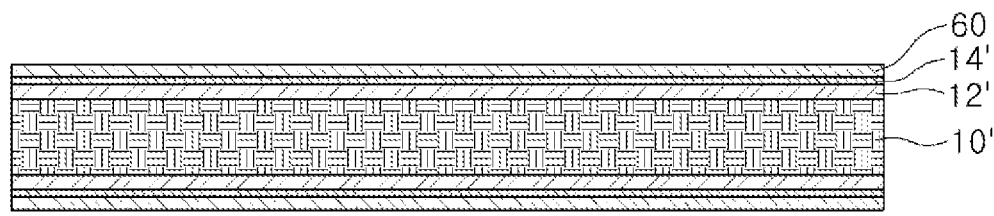

In FIG. 8B, an organic insulating layer 60 may be formed on the insulating core 10' prepared in FIG. 8A in the stacking direction Z of the printed circuit board. The organic insulating layer 60 may include an organic insulating material capable of being semi-hardened or partially hardened. For example, the organic insulating layer may include at least one of Ajinomoto Build-up Film (ABF) and polyimide, but is not limited thereto. A dielectric loss factor (Df) of the organic insulating layer 60 may be 0.010 or less, for example, 0.005 or less. In a case of using ABF and/or polyimide under such a condition, when a plurality of chips are mounted on the substrate 100 including a bridge, electrical characteristics at the time of high-speed signal transmission between the chips may be further improved. If necessary, a dielectric constant (Dk) of the organic insulating layer 60 may be 3.5 or less, for example, 3.2 or less.

Figure 9:
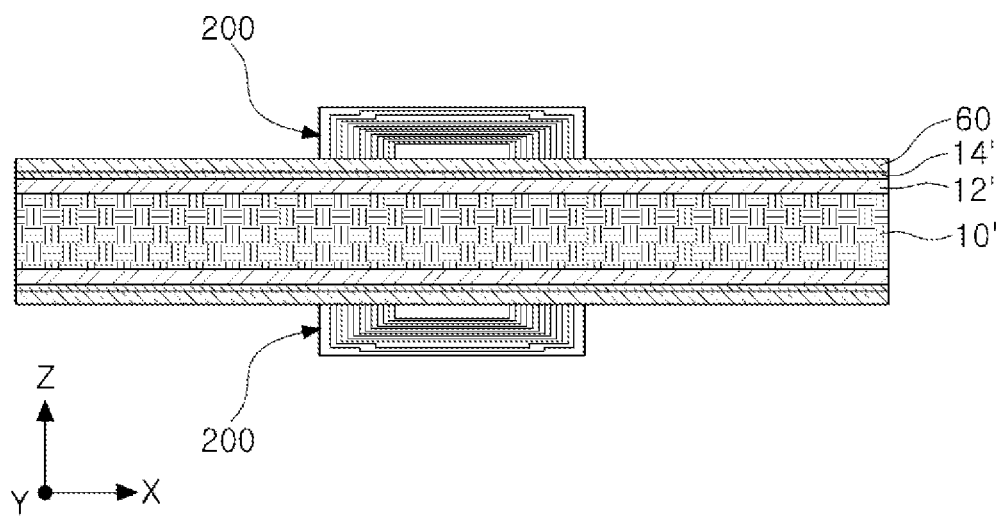

In FIG. 9, the bridge 200 may be vertically erected so that end portions of the first and second circuit wirings exposed to the upper surface of the bridge 200 face the organic insulating layer 60 and be attached to the organic insulating layer 60 formed in FIG. 8 in the stacking direction Z.

Figure 10:
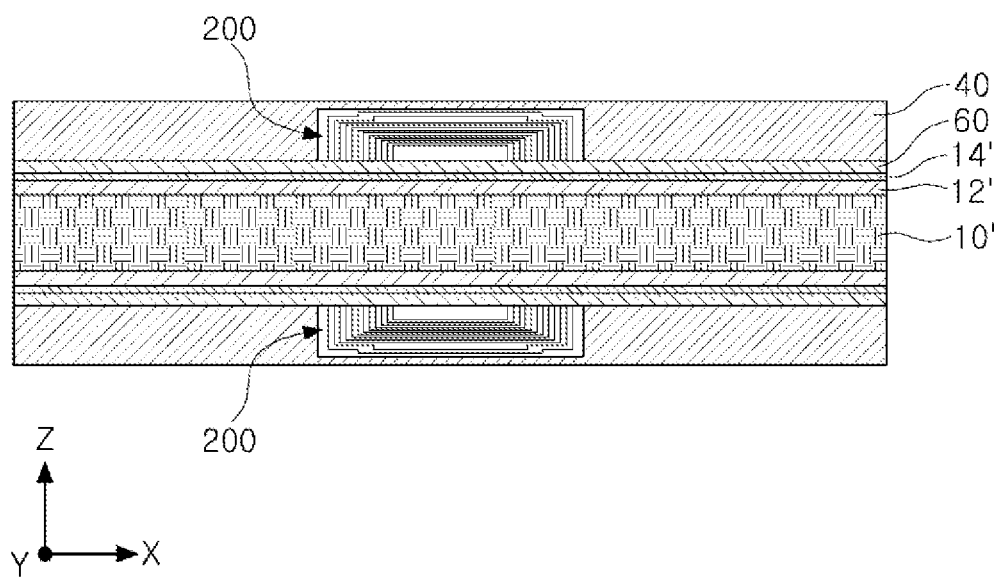

In FIG. 10, an insulating layer may be formed on the organic insulating layer 60 in order to form the second printed circuit board layer 40. In this case, the insulating layer may be stacked to surround side surfaces of the bridge 200.

Figure 11:
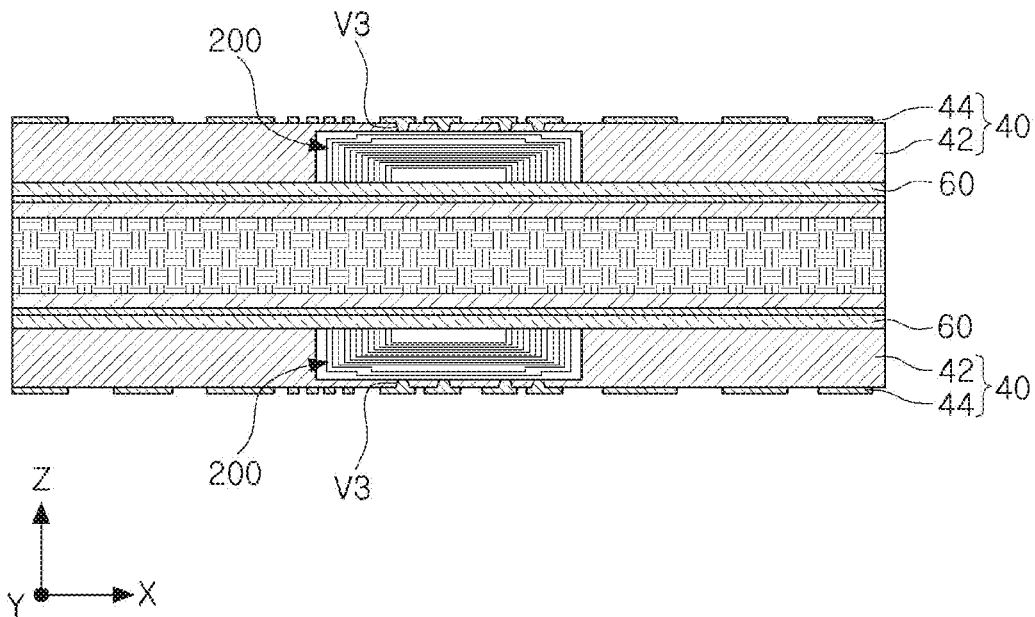

In FIG. 11, vias V3 may be formed in the insulating layer 42 on the upper surface of the bridge 200 and plated to form wirings according to a required circuit design. Further, a wiring layer 44 of a required substrate is formed on the insulating layer 42.

Figure 12:
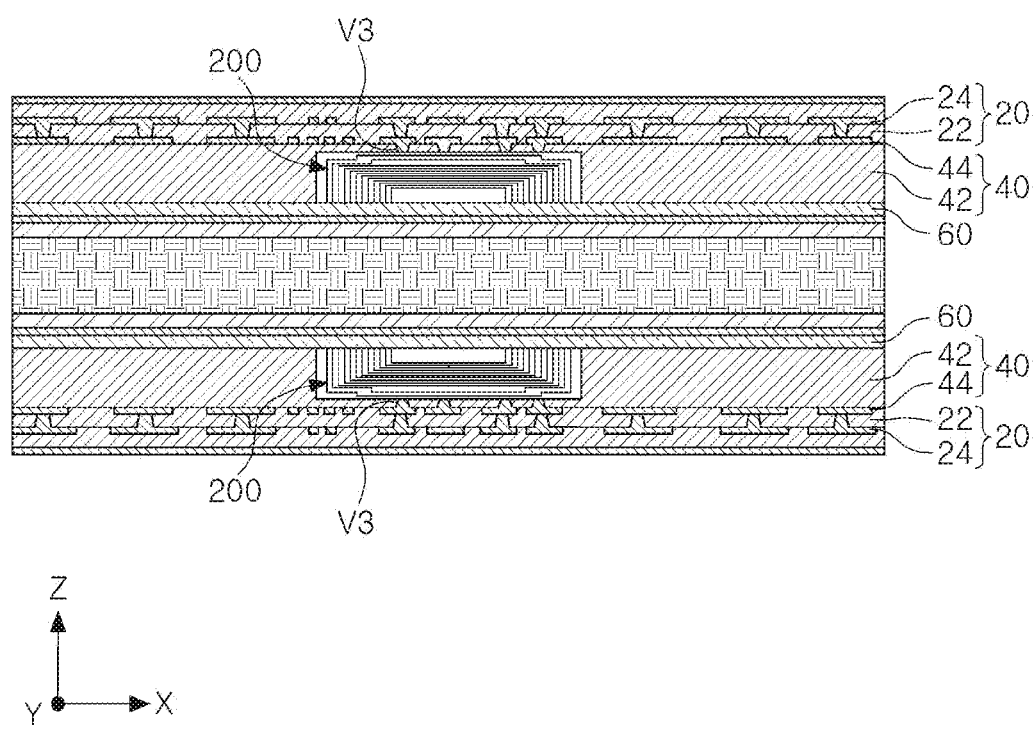

In addition, in FIG. 12, the first printed circuit board layer 20 including the insulating layer 22 and the wiring layer 22 may be stacked in the stacking direction Z on the second printed circuit board layer 40 formed in FIG. 11. Such a process may be repeated to stack a target number of layers.

Figure 13:
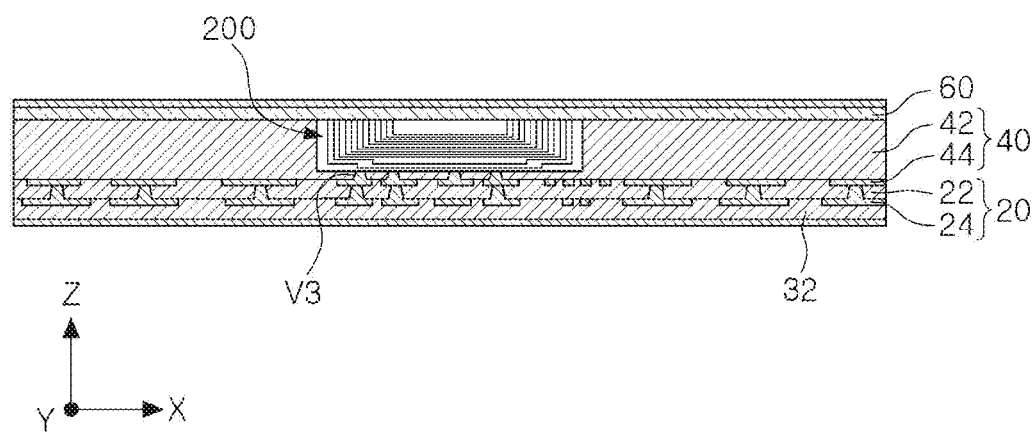
Figure 14:
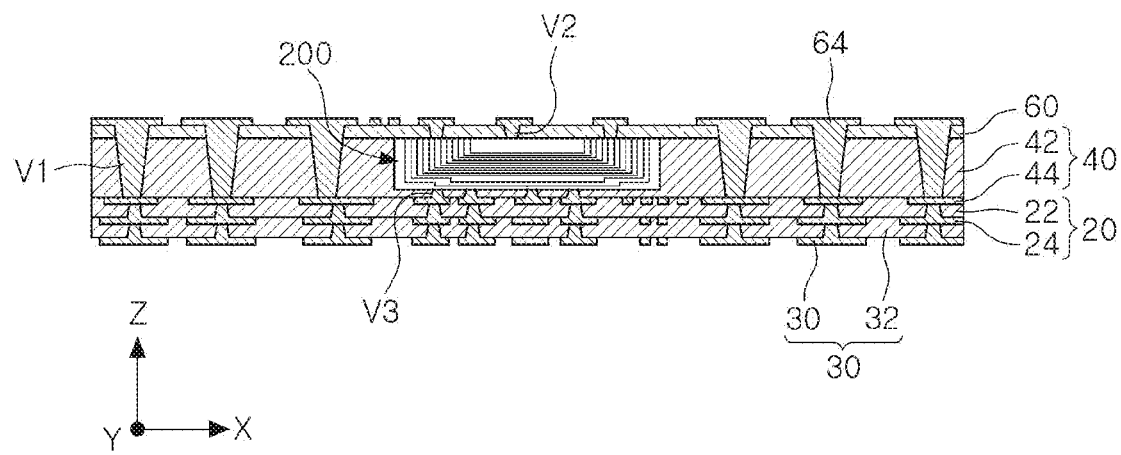

In FIG. 13, a laminate of FIG. 12 may be separated from the insulating core 10' and inverted upside down in the stacking direction Z. In FIG. 14, vias V1 and V2 may be formed in an upper portion in the stacking direction Z and plated to form wirings according to a required circuit design. In addition, a wiring layer 64 may be formed on the organic insulating layer 60 to form connection patterns with the chips.

Figure 15:
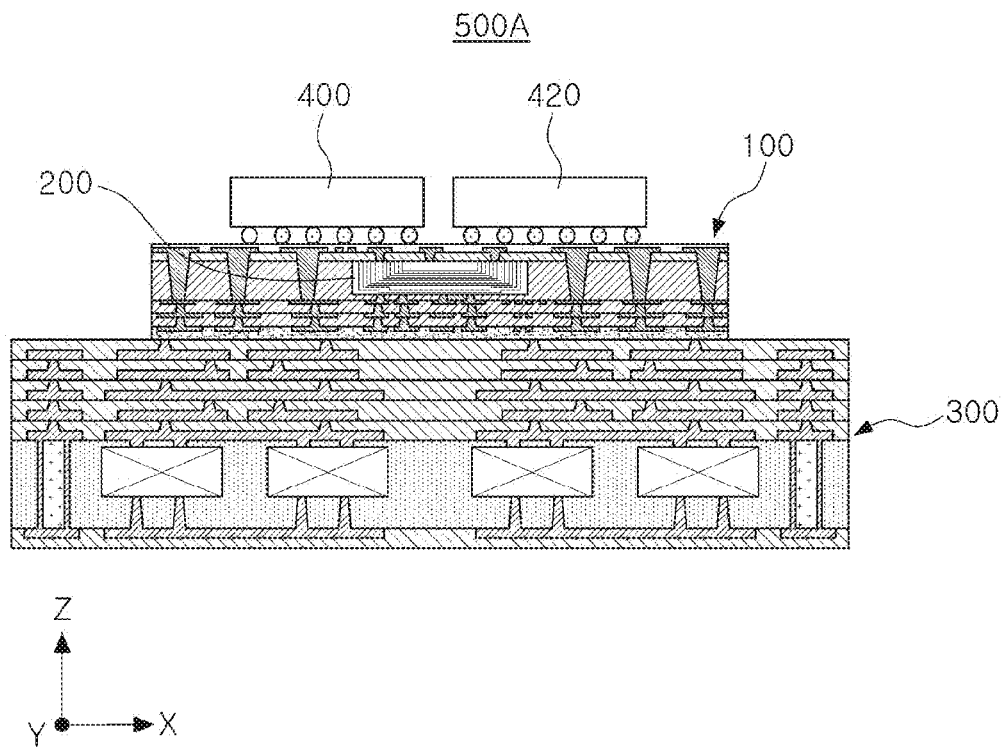
FIG. 15 is a schematic cross-sectional view illustrating an electronic device according to an exemplary embodiment in the present disclosure.

FIG. 15 is a schematic cross-sectional view illustrating an electronic device according to an exemplary embodiment in the present disclosure.

Referring to FIG. 15, an electronic device 500A according to an exemplary embodiment in the present disclosure may include a first printed circuit board layer 20, a bridge 200, first bridge insulating layers 220, second bridge insulating layers 240, a second printed circuit board layer 40, a first chip 400, and a second chip 420.

The bridge 200 used in the electronic device 500A according to the present exemplary embodiment is substantially the same as the bridge 200 described above, and an overlapping description thereof is thus omitted. The substrate 100 in which the bridge 200 is used may be installed in the form of an interposer between a main substrate 300 and the chips 400 and 420.

In the electronic device 500A according to the present exemplary embodiment, the bridge 200 may be disposed above the first printed circuit board layer 20. The first chip 400 may be electrically connected to the first circuit wirings of the bridge 200, and the second chip 420 may be electrically connected to the second circuit wirings of the bridge 200.

A first stacking direction Z in which the first insulating layer 22 of the first printed circuit board layer 20 and the second insulating layer 42 of the second printed circuit board layer 40 are stacked and a second stacking direction Y in which the first bridge insulating layers 220 and the second bridge insulating layers 240 are stacked may be different from each other.

In addition, the first stacking direction Z and the second stacking direction Y may be substantially orthogonal to each other, the first circuit wirings 202 and the second circuit wirings 204 may be substantially parallel to the first stacking direction Z and the third circuit wirings 205 may be substantially parallel to the second stacking direction Y.

The first chip 400 may be a logic chip electrically connected to the first circuit wirings 202, and the second chip 420 may be a memory chip electrically connected to the second circuit wirings 204. The first chip 400 and the second chip 420 may perform high-speed signal transmission.

Figure 16:
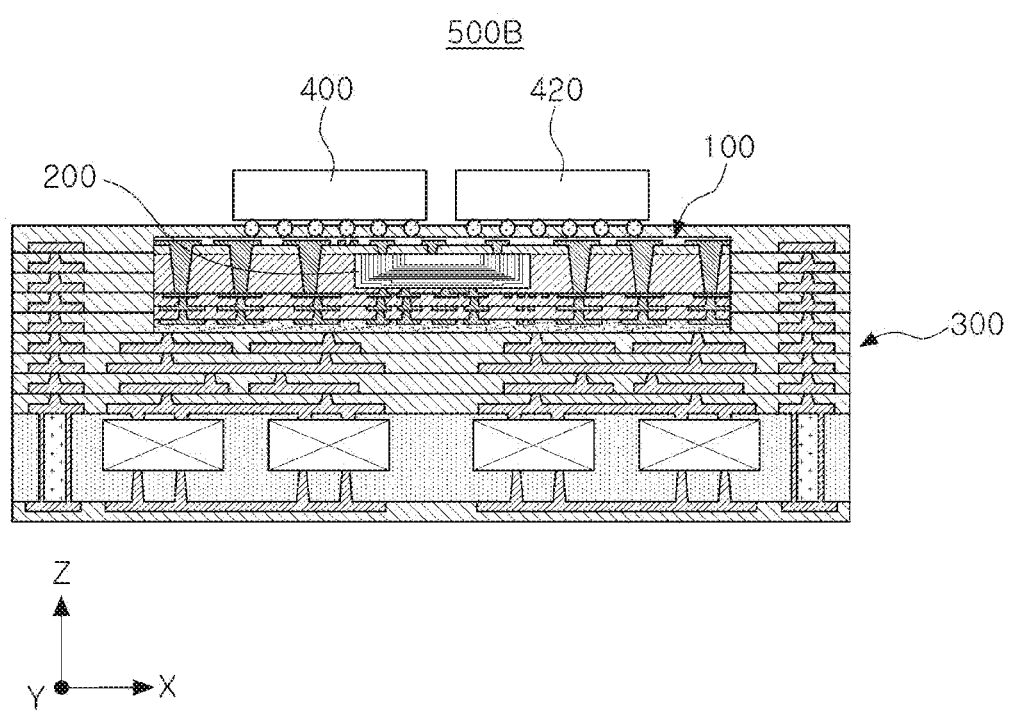
FIG. 16 is a schematic cross-sectional view illustrating an electronic device according to another exemplary embodiment in the present disclosure.

FIG. 16 is a schematic cross-sectional view illustrating an electronic device according to another exemplary embodiment in the present disclosure.

The electronic device according to another exemplary embodiment illustrated in FIG. 16 differs from the electronic device according to an exemplary embodiment illustrated in FIG. 15 in that the substrate 100 electrically connected to the first chip 400 and the second chip 420 is embedded in the main substrate 300. Other descriptions are the same as those of the electronic device of FIG. 15, and are thus omitted.

As set forth above, according to an exemplary embodiment in the present disclosure, the bridge may be embedded or mounted in the substrate without performing a separate process of forming a cavity in the substrate and without using a separate adhesive for bonding the bridge.

In addition, electrical characteristics may be improved because a microcircuit in the bridge for high-speed signal transmission between dies is formed using an organic substrate.

Further, since wirings in the bridge are not formed by a semiconductor process, a required cost may be low and a yield may be improved.

While exemplary embodiments have been shown and described above, it will be apparent to those skilled in the art that modifications and variations could be made without departing from the scope of the present invention as defined by the appended claims.

What is claimed is:

1. A substrate comprising:
   a first printed circuit board layer including a first insulating layer and a first wiring layer, disposed on a lower surface of the first insulating layer;
   a second wiring layer, disposed on an upper surface of the first insulating layer;
   a bridge disposed above the first printed circuit board layer and including a first circuit wiring, a second circuit wiring, and a third circuit wiring connecting the first circuit wiring and the second circuit wiring to each other;
   a first bridge insulating layer and a second bridge insulating layer, disposed in the bridge and on which the first circuit wiring and the second circuit wiring are disposed, respectively; and
   a second printed circuit board layer including a second insulating layer positioned to surround side surfaces of the bridge and cover the first insulating layer and the second wiring layer,
   wherein a first stacking direction in which the first insulating layer and the second insulating layer are stacked and a second stacking direction in which the first bridge insulating layer and the second bridge insulating layer are stacked are different from each other.

2. The substrate of claim 1, wherein the first stacking direction and the second stacking direction are substantially orthogonal to each other.

3. The substrate of claim 1, wherein the first circuit wiring and the second circuit wiring are substantially parallel to the first stacking direction, and the third circuit wiring is substantially parallel to the second stacking direction.

4. The substrate of claim 1, wherein the first circuit wiring, the second circuit wiring, and the third circuit wiring include metal layers formed of copper (Cu), aluminum (Al), silver (Ag), tin (Sn), gold (Au), and nickel (Ni), lead (Pb), titanium (Ti), or alloys thereof.

5. The substrate of claim 1, wherein an end portion of each of the first circuit wiring and the second circuit wiring is exposed to an upper surface of the bridge.

6. The substrate of claim 5, wherein the end portion is partially recessed in a boundary line between the first bridge insulating layer and the second bridge insulating layer, such that a virtual line of the boundary line passes through the end portion.

7. The substrate of claim 6, wherein at least one of the first circuit wiring, the second circuit wiring, and the third circuit wiring includes copper (Cu), and the end portion includes tin (Sn).

8. The substrate of claim 1, wherein the third circuit wiring of the bridge is connected to the second wiring layer through a via.

9. The substrate of claim 1, further comprising an organic insulating layer disposed on an upper surface of the bridge, wherein the organic insulating layer is stacked in the first stacking direction and is substantially orthogonal to the second stacking direction.

10. The substrate of claim 9, further comprising an external wiring layer disposed on an upper surface of the organic insulating layer,
    wherein the external wiring layer is connected to the second wiring layer through a first via penetrating through the organic insulating layer and the second insulating layer.

11. The substrate of claim 9, further comprising an external wiring layer disposed on an upper surface of the organic insulating layer,
    wherein the external wiring layer is connected to at least one of the first circuit wiring and the second circuit wiring of the bridge through a second via passing through the organic insulating layer.

12. The substrate of claim 1, wherein thicknesses of the first bridge insulating layer and the second bridge insulating layer are smaller than thicknesses of the first insulating layer and the second insulating layer.

13. The substrate of claim 1, wherein at least one of the first insulating layer and the second insulating layer includes at least one of Ajinomoto build-up film (ABF) and polyimide.

14. An electronic device comprising:
    a substrate including: a first printed circuit board layer including a first insulating layer and a first wiring layer, disposed on a lower surface of the first insulating layer; a bridge disposed above the first printed circuit board layer and including a first circuit wiring, a second circuit wiring, and a third circuit wiring connecting the first circuit wiring and the second circuit wiring to each other; a first bridge insulating layer and a second bridge insulating layer, disposed in the bridge and on which the first circuit wiring and the second circuit wiring are disposed, respectively; and a second printed circuit board layer including a second insulating layer positioned to surround side surfaces of the bridge,
    a first chip connected to the first circuit wiring;
    a second chip connected to the second circuit wiring; and
    a main substrate on which the substrate connected to the first chip and the second chip is mounted,
    wherein the substrate is stacked in the form of an interposer between the first and second chips and the main substrate, and
    a first stacking direction in which the first insulating layer and the second insulating layer are stacked and a second stacking direction in which the first bridge insulating layer and the second bridge insulating layer are stacked are different from each other.

15. The electronic device of claim 14, wherein the first stacking direction and the second stacking direction are substantially orthogonal to each other, and
    the first circuit wiring and the second circuit wiring are substantially parallel to the first stacking direction, and the third circuit wiring is substantially parallel to the second stacking direction.

16. The electronic device of claim 14, wherein the first chip is a logic chip connected to the first circuit wiring,
    the second chip includes a memory chip connected to the second circuit wiring, and
    the first chip and the second chip are configured to perform high-speed signal transmission.

17. A substrate comprising:
a first insulating layer;
a bridge disposed on the first insulating layer, and including circuit wiring layers and bridge insulating layers alternately stacked in a direction different from a stacking direction of the bridge and the first insulating layer;
a second wiring layer partially embedded in the first insulating layer;
a second insulating layer disposed on the first insulating layer, covering side surfaces of the bridge, and including a portion extending between the bridge and the second wiring layer, the second wiring layer disposed below the second insulating layer and protruding from the second insulating layer towards an interior of the first insulating layer; and
a third via disposed in the portion of the second insulating layer between the bridge and the first-second wiring layer to connect one of the circuit wiring layers to the second wiring layer.

18. The substrate of claim 17, wherein an end portion of the one of the circuit wiring layers is exposed to an upper surface of the bridge and the one of the circuit wiring layers is spaced apart from a lower surface of the bridge opposing the upper surface.

19. The substrate of claim 17, further comprising:
an organic insulating layer disposed on the bridge and the second insulating layer; and
an external wiring layer disposed on the organic insulating layer.

20. The substrate of claim 19, further comprising:
a first via penetrating through the second insulating layer and the organic insulating layer to connect the external wiring layer and the second wiring layer; and
a second via penetrating through the organic insulating layer to connect the external wiring layer to an end portion of the one of the circuit wiring layers.

21. The substrate of claim 17, wherein opposing ends of the circuit wiring layers, exposed to a surface of the bridge, are respectively disposed on opposing sides of the surface of the bridge.

* * * * *